(12) United States Patent
Ito et al.

(10) Patent No.: US 12,514,127 B2
(45) Date of Patent: Dec. 30, 2025

(54) ELECTRONIC DEVICE AND METHOD FOR MANUFACTURING ELECTRONIC DEVICE

(71) Applicant: SEIKO EPSON CORPORATION, Tokyo (JP)

(72) Inventors: Keita Ito, Okaya (JP); Hiroyuki Ogiso, Ina (JP); Masateru Tochimoto, Minamisoma (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1016 days.

(21) Appl. No.: 17/580,975

(22) Filed: Jan. 21, 2022

(65) Prior Publication Data

US 2022/0238783 A1    Jul. 28, 2022

(30) Foreign Application Priority Data

Jan. 25, 2021 (JP) ................. 2021-009356
Jun. 23, 2021 (JP) ................. 2021-103914

(51) Int. Cl.
*H01L 41/053* (2006.01)
*H10N 30/02* (2023.01)
*H10N 30/87* (2023.01)
*H10N 30/88* (2023.01)

(52) U.S. Cl.
CPC ............ *H10N 30/88* (2023.02); *H10N 30/02* (2023.02); *H10N 30/87* (2023.02)

(58) Field of Classification Search
CPC .. H10N 30/708; H10N 30/878; H10N 30/853; H10N 30/302

USPC .......................... 310/338, 348, 358
See application file for complete search history.

(56) References Cited

U.S. PATENT DOCUMENTS

| | | | |
|---|---|---|---|
| 2010/0302756 A1 | 12/2010 | Otsuki | |
| 2013/0257221 A1* | 10/2013 | Yamaji | H03H 9/132 310/313 B |
| 2015/0243875 A1 | 8/2015 | Hira et al. | |
| 2016/0254255 A1 | 9/2016 | Hori et al. | |
| 2018/0159496 A1 | 6/2018 | Na et al. | |
| 2020/0284815 A1* | 9/2020 | Ogura | H10N 30/20 |
| 2021/0123945 A1 | 4/2021 | Kazuno | |

FOREIGN PATENT DOCUMENTS

| | | |
|---|---|---|
| CN | 105765716 A | 7/2016 |
| CN | 108155887 A | 6/2018 |
| JP | 2010-278186 | 12/2010 |
| JP | 2013-239947 | 11/2013 |
| JP | 2021-071294 | 5/2021 |

\* cited by examiner

*Primary Examiner* — Derek J Rosenau
(74) *Attorney, Agent, or Firm* — Rankin, Hill & Clark LLP (57) ABSTRACT

An electronic device includes: an electronic component including an inertial element, a base including a substrate to which the inertial element is fixed and a frame portion provided to surround the inertial element in a plan view, a first lid bonded to the frame portion so as to accommodate the inertial element between the first lid and the base, a second lid provided to face the first lid, and a bonding member disposed between the first lid and the second lid; and a molded portion covering the electronic component.

7 Claims, 8 Drawing Sheets

ELECTRONIC DEVICE AND METHOD FOR MANUFACTURING ELECTRONIC DEVICE

The present application is based on, and claims priority from JP Application Serial Number 2021-009356, filed Jan. 25, 2021, and JP Application Serial Number 2021-103914, filed Jun. 23, 2021, the disclosures of which are hereby incorporated by reference herein in their entirety.

BACKGROUND

1. Technical Field

The present disclosure relates to an electronic device and a method for manufacturing an electronic device.

2. Related Art

For example, in a vibration device described in JP-A-2013-239947, a pair of lid bodies are bonded to upper and lower surfaces of a frame portion coupled to an outer edge of a vibration portion and provided so as to surround the outer edge of the vibration portion in a plan view, so that the vibration portion is accommodated. In addition, a shield plate is provided on the lid body on the upper surface via an insulating layer, and a terminal for electrically coupling to an external circuit is formed on the lid body on the upper surface and the shield plate.

However, in the vibration device described in JP-A-2013-239947, a notch is provided in the shield plate bonded to an upper surface of the lid body in order to form a terminal electrically coupled to the external circuit. For this reason, a strength becomes insufficient, and when the vibration device is resin-molded, there is a problem that the lid body together with the shield plate is bent and vibration characteristics are changed due to a pressure received from a molten resin at the time of molding. In particular, in a case of an electronic device including a sensor element or the like, there is a concern that deterioration of characteristics of the sensor element and breakage of the sensor element may occur due to deformation of the lid body.

SUMMARY

An electronic device includes: an electronic component including an inertial element, a base including a substrate to which the inertial element is fixed and a frame portion provided to surround the inertial element in a plan view, a first lid bonded to the frame portion so as to accommodate the inertial element between the first lid and the base, a second lid provided to face the first lid and having an outer edge flush with or protruding from an outer edge of the first lid, and a rigid member disposed between the first lid and the second lid; and a molded portion covering the electronic component.

A method for manufacturing an electronic device includes: disposing an inertial element in a region surrounded by a frame portion of a base, and fixing the inertial element to a substrate of the base; bonding a first lid to the frame portion of the base so as to accommodate the inertial element between the first lid and the base; disposing a second lid such that the second lid faces the first lid via a rigid member and an outer edge of the second lid is flush with or protrudes from an outer edge of the first lid; mounting an electronic component including the rigid member and the second lid on a printed substrate including a lead terminal; and forming a molded portion covering the electronic component by a transfer molding method.

DESCRIPTION OF EXEMPLARY EMBODIMENTS

1. First Embodiment

1.1. Electronic Device

First, an electronic device 1 according to a first embodiment will be described with reference to FIGS. 1 to 6.

Figure 1:
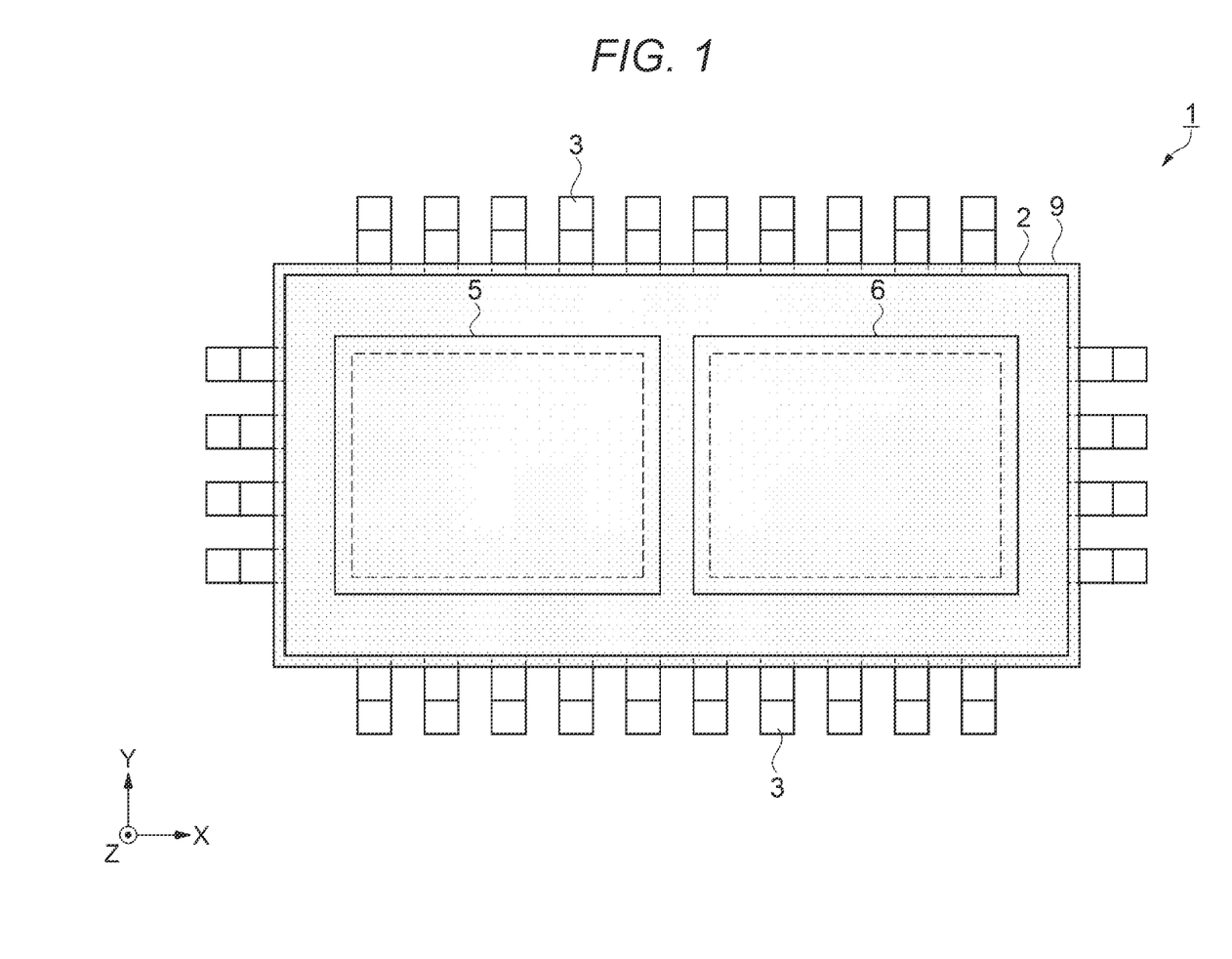
FIG. 1 is a plan view showing a schematic structure of an electronic device according to a first embodiment.
Figure 2:
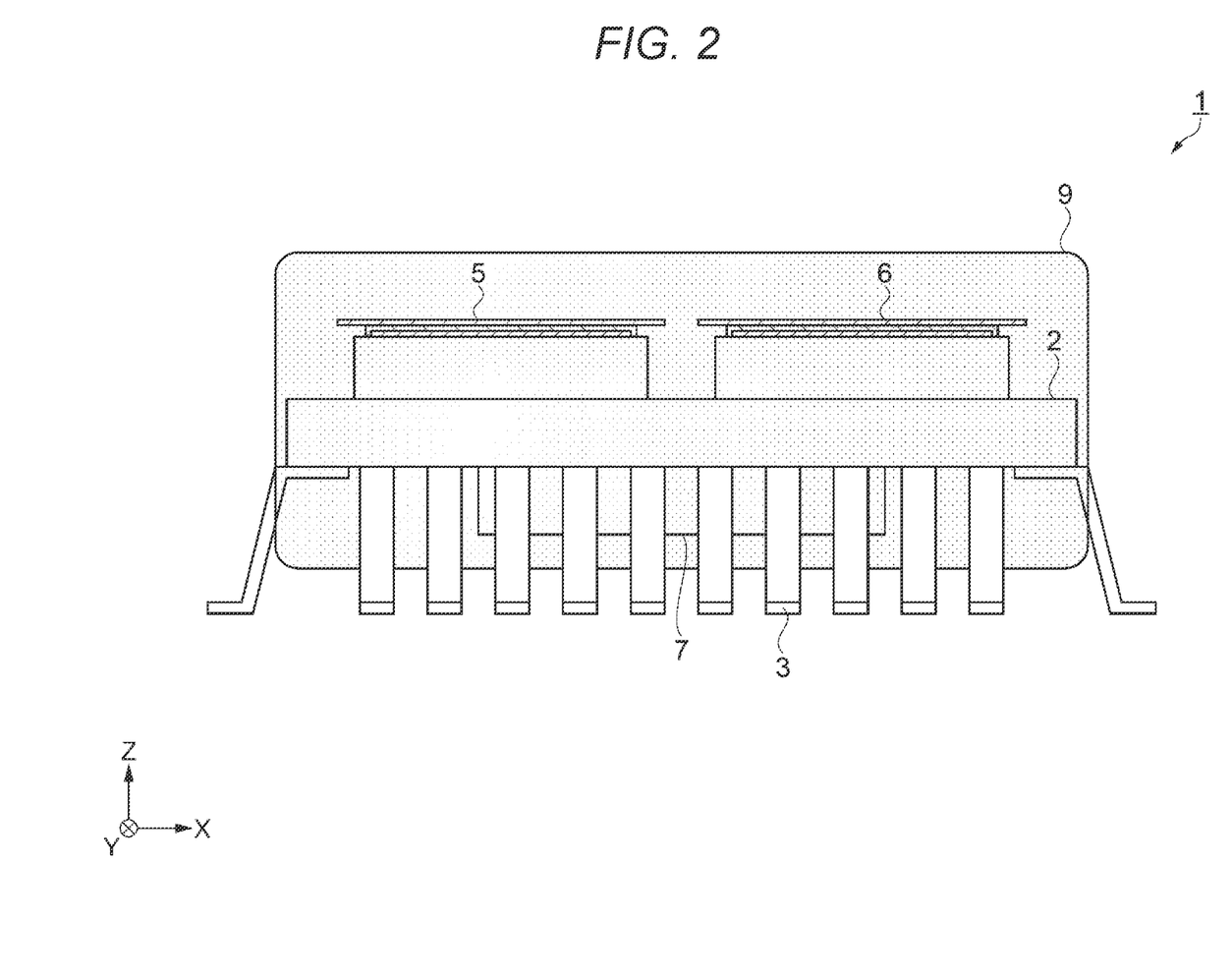
FIG. 2 is a side view showing the schematic structure of the electronic device according to the first embodiment.

In order to make a structure of the electronic device 1 easier to understand, a molded portion 9 in FIGS. and 2 is illustrated as being translucent. For convenience of the description, in the following drawings, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side in each axis is also referred to as a "plus side", a side opposite to the arrow is also referred to as a "minus side". A plus side in the Z direction is also referred to as "upper", and a minus side in the Z direction is also referred to as "lower".

The electronic device 1 includes a printed substrate 2 having a plurality of lead terminals 3, electronic components 5, 6 disposed on an upper surface of the printed substrate 2, an IC chip 7 disposed on a lower surface of the printed substrate 2, and the molded portion covering the printed substrate 2, the electronic components 5, 6, and the IC chip 7.

Each of the electronic components 5, 6 is a sensor component. Specifically, the electronic component 5 is an X-axis angular velocity sensor that detects an angular velocity around the X axis, and the electronic component 6 is a three-axis acceleration sensor that independently detects an acceleration in the X-axis direction, an acceleration in the Y-axis direction, and an acceleration in the Z-axis direction.

In the present embodiment, the electronic component 5 is the X-axis angular velocity sensor, but the present disclosure is not limited thereto, and the angular velocity sensor may be a Y-axis angular velocity sensor that detects an angular velocity around the Y axis or a Z-axis angular velocity sensor that detects an angular velocity around the Z axis.

The configuration of the electronic device 1 may be a six-axis composite sensor including three angular velocity sensors, that is, the X-axis angular velocity sensor, the Y-axis angular velocity sensor, and the Z-axis angular velocity sensor, and the three-axis acceleration sensor. The electronic components 5, 6 are not limited to sensor components, and may be, for example, vibration components such as vibrators.

The lead terminals 3 provided on the printed substrate 2 are electrically coupled to the electronic components 5, 6 and the IC chip 7 by wirings (not shown) provided on the upper and lower surfaces of the printed substrate 2. The electronic components 5, 6 and the IC chip 7 are electrically coupled to each other by through wirings (not shown) or the like provided in the printed substrate 2.

The molded portion 9 molds, that is, resin-seals, the printed substrate 2, the two electronic components 5, 6, and the IC chip 7, so that the printed substrate 2, the two electronic components 5, 6, and the IC chip 7 are protected from moisture, dust, impact, and the like. A mold material forming the molded portion 9 is not particularly limited, for example, a thermosetting epoxy resin can be used, and the molded portion 9 can be molded by a transfer molding method.

Here, in the transfer molding method, the electronic components 5, 6 and the IC chip 7 are disposed in a molding die in a state of being mounted on the printed substrate 2, the molding die is filled with a molten or softened mold material M via a gate, and then the mold material M is cured or solidified to form the mold portion covering the printed substrate 2, the electronic components 5, 6, and the IC chip 7. However, since a space shape of the inside of the molding die becomes complicated, it is difficult to uniformly fill the molten or softened mold material M into the molding die. In particular, it is difficult to fill the mold material M on back sides of each of the electronic components 5, 6 and the IC chip 7 and spaces between each of the electronic components 5, 6 and the IC chip 7 and side surfaces of the molding die, and there is a chance that voids, which are air bubbles, are generated in such portions, which causes deterioration of characteristics of the electronic device 1 and breakage of the electronic device 1.

In order to prevent the generation of such voids, a method for filling the molding die with the molten or softened mold material M at a higher pressure is considered. As a result, the molding material M can be more reliably filled even in a portion in which the mold material M is difficult to be filled, and the generation of the voids can be effectively prevented. However, in such a method, as shown in FIGS. 3 and 4, in an electronic component having a structure of the related art, a first lid 20 bonded to a base 10 is bent inward due to a pressure received from the mold material M, and an inertial element 30 may fail or characteristics of the electronic component may deteriorate.

Figure 3:
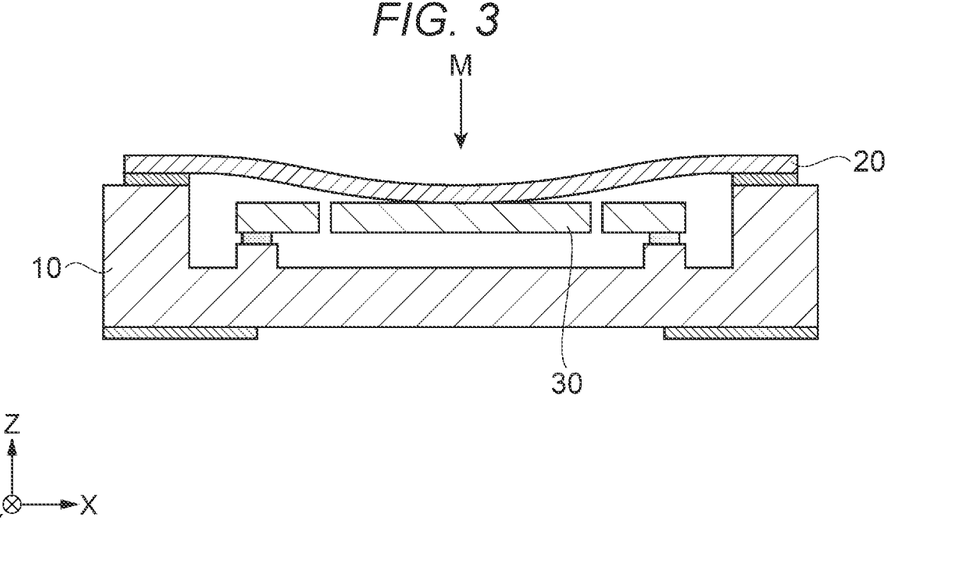
FIG. 3 is a cross-sectional view showing deformation of a lid that occurs in a configuration of the related art.
Figure 4:
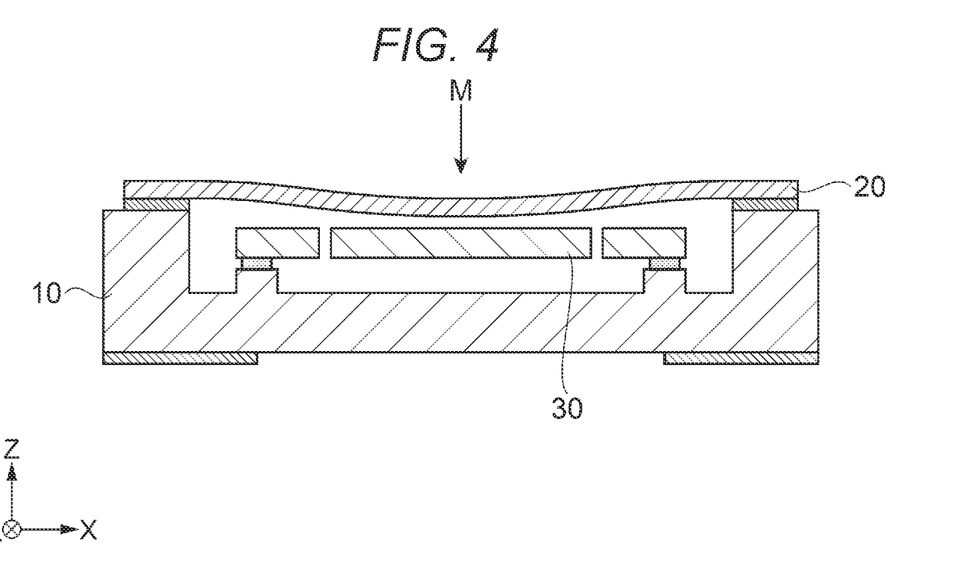
FIG. 4 is a cross-sectional view showing the deformation of the lid that occurs in the configuration of the related art.

In particular, as shown in FIG. 3, the first lid 20 may come into contact with the inertial element 30, and the inertial element 30 may be damaged or the inertial element 30 cannot be appropriately driven. Further, as shown in FIG. 4, even when the first lid 20 does not contact with the inertial element 30, an electrostatic capacitance is formed between the inertial element 30 and the first lid 20 or a magnitude of the originally formed electrostatic capacitance changes due to the first lid 20 approaching the inertial element 30. Therefore, characteristics of the inertial element 30 change, in particular, zero-point drift occurs, and an angular velocity detection characteristic of the electronic component deteriorates.

Figure 5:
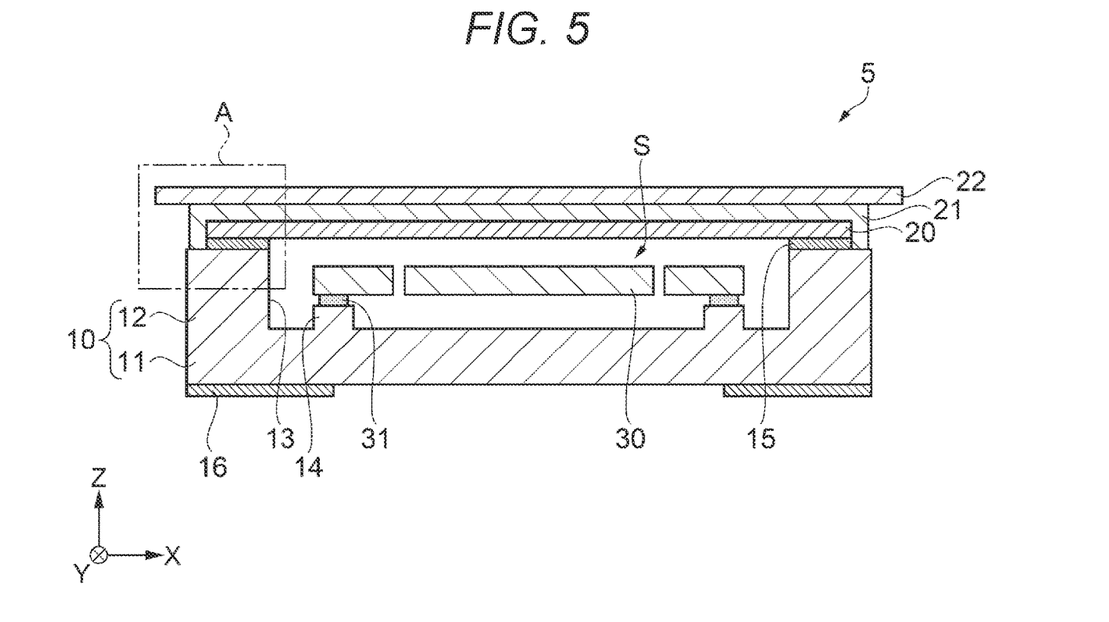
FIG. 5 is a cross-sectional view showing a schematic structure of an electronic component included in the electronic device.

Therefore, in the present embodiment, in order to prevent the deformation of the first lid 20 due to the pressure from the mold material M caused by the forming of the molded portion 9, a double lid structure in which a second lid 22 is bonded to an upper surface of the first lid 20 via a rigid member 21 and a bending strength of the first lid 20 is increased is adopted.

Next, configurations of the electronic components 5, 6 will be described in detail. Since the electronic component 5 and the electronic component 6 have substantially the same configuration except that the electronic component 5 and the electronic component 6 are different in a shape of the inertial element 30 accommodated in the base 10 or the like, the electronic component 5 will be described as a representative, and the description of the electronic component 6 will be omitted.

As shown in FIG. 5, the electronic component 5 includes the base 10, the first lid 20, and the inertial element 30 that is an angular velocity sensor element accommodated in an internal space S formed by the base 10 and the first lid 20.

The base 10 has a rectangular shape in a plan view from the Z direction, and includes a substrate 11 including a convex portion 14 for fixing the inertial element 30, and a frame portion 12 provided so as to surround the inertial element 30 in the plan view, and the substrate 11 and the frame portion 12 are integrally formed. The inertial element 30 is fixed to an upper surface of the convex portion 14 via a bonding member 31. Further, a seam ring 15 is provided on the upper surface of the frame portion 12, and the first lid 20 is bonded to the seam ring 15, so that the inner space S for accommodating the inertial element 30 is formed by the first lid 20 and a concave portion 13 of the base 10. An external terminal 16 for electrically coupling the inertial element 30 and the IC chip 7 is provided on a lower surface of the substrate 11.

The base 10 is made of, for example, various ceramics such as alumina and titania, but a constituent material of the base 10 is not particularly limited.

The first lid 20 has a rectangular shape in the plan view from the Z direction, the second lid 22 having a rectangular shape in the plan view is disposed on an upper surface side which is a surface of the first lid 20 opposite to an inertial element 30 side, the rigid member 21 is disposed between the first lid 20 and the second lid 22, and the first lid 20 and the second lid 22 are bonded to each other by the rigid member 21. Therefore, it is possible to prevent the deformation of the first lid 20 due to the pressure from the mold material M caused by the forming of the molded portion 9.

The first lid 20 and the second lid 22 are made of, for example, a metal material such as Kovar, but constituent materials of the first lid 20 and the second lid 22 are not particularly limited.

Figure 6:
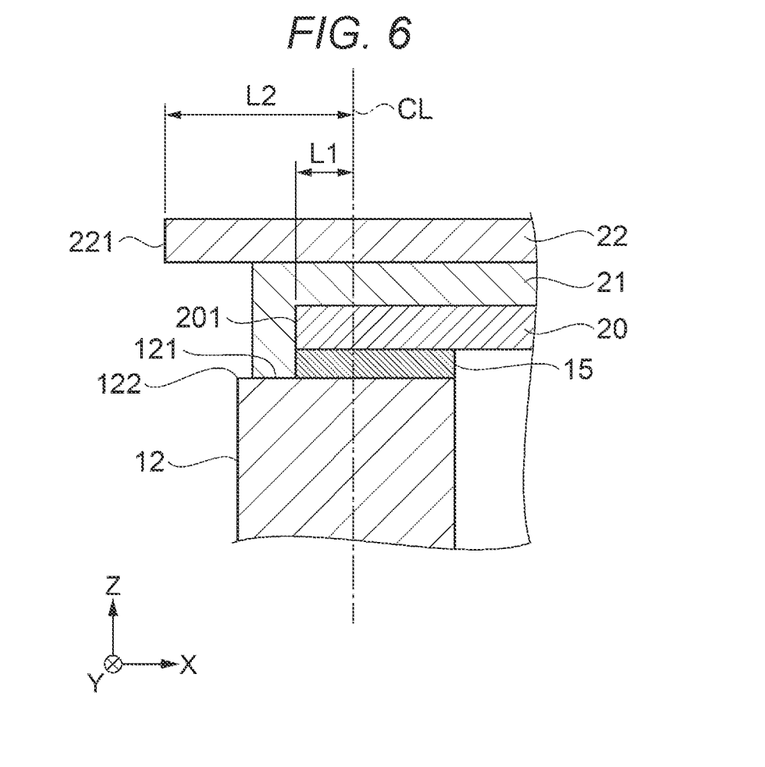
FIG. 6 is an enlarged view of a portion A in FIG. 5.

An outer edge 201 of the first lid 20 is provided on a side closer to an outer edge 122 of the frame portion 12 with respect to a center of an upper surface 121 of the frame portion 12 of the base 10, and is provided on an outer side with respect to the center of the upper surface 121 of the frame portion 12 and on an inner side with respect to the outer edge 122 of the upper surface 121 of the frame portion 12. Specifically, as shown in FIG. 6, the outer edge 201 of the first lid 20 on a minus side in the X direction is disposed on the minus side in the X direction with respect to a center line CL of the frame portion 12 of the base 10 in the X direction, and is disposed on a plus side in the X direction with respect to the outer edge 122 of the upper surface 121 of the frame portion 12. The outer edge 201 of the first lid 20 on the plus side in the X direction is disposed on the plus side in the X direction with respect to the center line CL of the frame portion 12 of the base 10 in the X direction, and is disposed on the minus side in the X direction with respect to the outer edge 122 of the upper surface 121 of the frame portion 12. Further, the outer edge 201 of the first lid 20 in the Y direction is disposed on an outer side with respect to the center line CL of the frame portion 12 of the base 10 in the Y direction, and is provided on an inner side with respect to the outer edge 122 of the upper surface 121 of the frame portion 12.

The second lid 22 is provided so as to face the first lid 20, and an outer edge 221 of the second lid 22 protrudes from the outer edge 201 of the first lid 20. Specifically, as shown in FIG. 6, a distance L2 between the outer edge 221 of the second lid 22 and the center line CL of the frame portion 12 of the base 10 in the X direction is longer than a distance L1 between the outer edge 201 of the first lid 20 and the center line CL of the frame portion 12 of the base 10 in the X direction. In the plan view from the Z direction, an outer shape of the second lid 22 is larger than an outer shape of the first lid 20, that is, a length of the second lid 22 in the X direction is longer than a length of the first lid 20 in the X direction, and a length of the second lid 22 in the Y direction is longer than a length of the first lid 20 in the Y direction.

The rigid member 21 is disposed between the first lid 20 and the second lid 22, and has a function of bonding the second lid 22 to the first lid 20. The rigid member 21 protrudes from the outer edge 201 of the first lid 20 and is in contact with the upper surface 121 of the frame portion 12 of the base 10. Therefore, it is possible to further prevent the deformation of the first lid 20 due to the pressure from the mold material M caused by the forming of the molded portion 9.

As a constituent material of the rigid member 21, an epoxy resin, a polyimide resin, a polyamide resin, or the like is suitable. A glass transition temperature Tg of the rigid member 21 is lower than a molding temperature T of the molded portion 9 by not more than 40° C. Specifically, when the molding temperature T of the molded portion 9 is 150° C., the glass transition temperature Tg of the rigid member 21 is 110° C. or higher, and when the molding temperature T of the molded portion 9 is 175° C., the glass transition temperature Tg of the rigid member 21 is 135° C. or higher. The glass transition temperature Tg of the rigid member 21 is preferably lower than the molding temperature T of the molded portion 9 by not more than 25° C. A flexural modulus FS of the rigid member 21 is preferably 10 GPa or more.

As described above, in the electronic device 1 according to the present embodiment, the second lid 22 is bonded, via the rigid member 21, to the upper surface of the first lid 20 bonded to the frame portion 12 so as to accommodate the inertial element 30, and thus the bending strength of the first lid 20 is increased, so that it is possible to prevent the bending deformation of the first lid 20 toward the inertial element 30 side due to the pressure from the mold material M caused by the forming of the molded portion 9.

Since the outer edge 201 of the first lid 20 is provided on the side closer to the outer edge 122 of the frame portion 12 with respect to the center of the upper surface 121 of the frame portion 12 of the base 10, it is possible to make it difficult for the first lid 20 to be deformed and bend toward the inertial element 30 side.

The rigid member 21 protrudes from the outer edge 201 of the first lid 20 and is in contact with the upper surface 121 of the frame portion 12 of the base 10, and thus the bending strength of the first lid 20 is further increased, so that it is possible to further prevent the bending deformation of the first lid 20 toward the inertial element 30 side due to the pressure from the mold material M caused by the forming of the molded portion 9.

The glass transition temperature Tg of the rigid member 21 is lower than the molding temperature of the molded portion 9 by not more than 40°, and thus when the molded portion 9 is formed, the rigid member 21 is less likely to be liquefied, and the second lid 22 can be prevented from being peeled off.

1.2. Manufacturing Method

Next, a method for manufacturing the electronic device 1 according to the first embodiment will be described with reference to FIG. 7.

Figure 7:
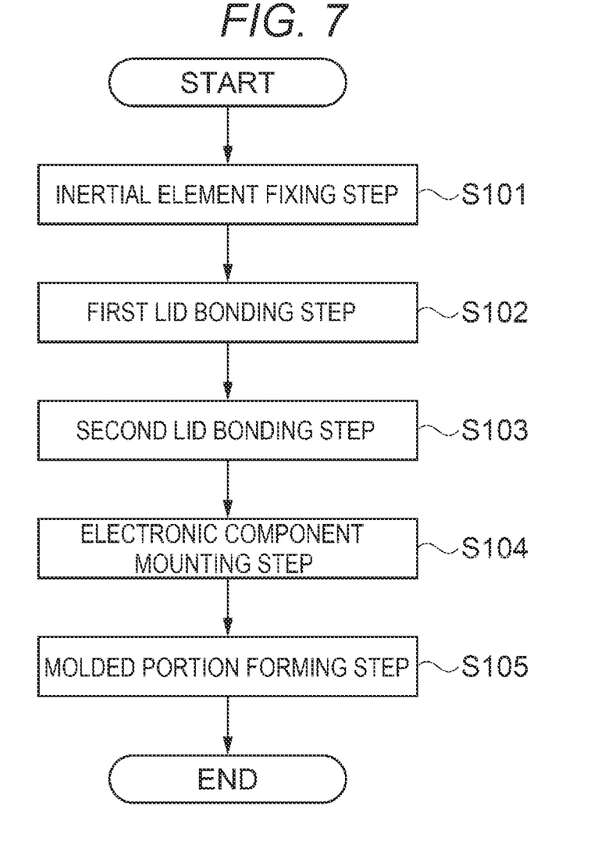
FIG. 7 is a flowchart showing a method for manufacturing the electronic device according to the first embodiment.

As shown in FIG. 7, the method for manufacturing the electronic device 1 according to the present embodiment includes an inertial element fixing step, a first lid bonding step, a second lid bonding step, an electronic component mounting step, and a molded portion forming step.

1.2.1. Inertial Element Fixing Step

First, in step S101, the inertial element 30 is formed by a silicon substrate being vertically processed by a Bosch process which is a deep etching technique, the inertial element 30 is disposed in a region surrounded by the frame portion 12 of the base 10, and the inertial element 30 is fixed to the upper surface of the convex portion 14 of the substrate 11 via the bonding member 31.

1.2.2. First Lid Bonding Step

In step S102, the first lid 20 is welded and bonded to the upper surface 121 of the frame portion 12 of the base 10 via the seam ring 15 so as to accommodate the inertial element 30 between the first lid 20 and the base 10.

1.2.3. Second Lid Bonding Step

In step S103, the second lid 22 is disposed such that the second lid 22 faces the first lid 20 via the rigid member 21 and the outer edge 221 protrudes from the outer edge 201 of the first lid 20, and the second lid 22 is bonded to the first lid 20 by the rigid member 21.

1.2.4. Electronic Component Mounting Step

In step S104, the electronic components 5, 6 manufactured in steps S101 to S103 and the IC chip 7 including a circuit for driving the electronic components 5, 6 are mounted on the printed substrate 2 having the lead terminals 3.

1.2.5. Molded Portion Forming Step

In step S105, the printed substrate 2 on which the electronic components 5, 6 and the IC chip 7 are mounted is placed in the molding die, and the molded portion 9 covering the printed substrate 2, the electronic components 5, 6, and the IC chip 7 is formed by a transfer molding method in which the molding die is filled with the molten or softened mold material M at a high pressure. The molding temperature of the molded portion 9 is 150° C. to 175° C.

In the present manufacturing method, after the first lid 20 is bonded to the base 10, the second lid 22 is bonded onto the first lid 20 via the rigid member 21, but the present disclosure is not limited thereto. After the second lid 22 is bonded onto the first lid 20 via the rigid member 21, the first lid 20 on which the second lid 22 is bonded may be bonded to the base 10.

According to the method for manufacturing the electronic device 1 described above, it is possible to reduce the voids generated at the time of forming the molded portion 9, and to prevent the bending deformation of the first lid 20 toward the inertial element 30 side due to the pressure from the mold material M caused by the forming of the molded portion 9. Therefore, it is possible to obtain the electronic device 1 in which the breakage of the inertial element 30 and the deterioration of the characteristics of the electronic component 5, 6 are less likely to occur.

2. Second Embodiment

Next, an electronic device 1a according to a second embodiment will be described with reference to FIGS. 8 and 9.

The electronic device 1a according to the present embodiment is the same as the electronic device 1 according to the first embodiment except that a size of the second lid 22a of the electronic component 5a and the configuration of the rigid member 21a are different from those of the electronic device 1 according to the first embodiment. Differences from the first embodiment described above will be mainly described, the same elements will be denoted by the same reference numerals, and description thereof will be omitted.

Figure 8:
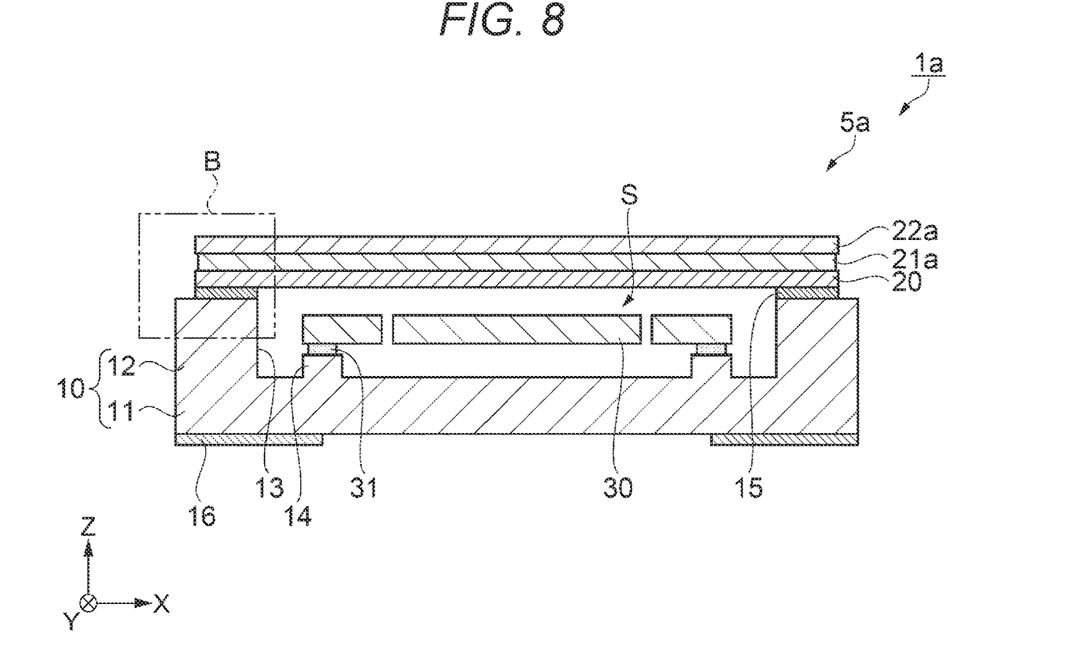
FIG. 8 is a cross-sectional view showing a schematic structure of an electronic component included in an electronic device according to a second embodiment.
Figure 9:
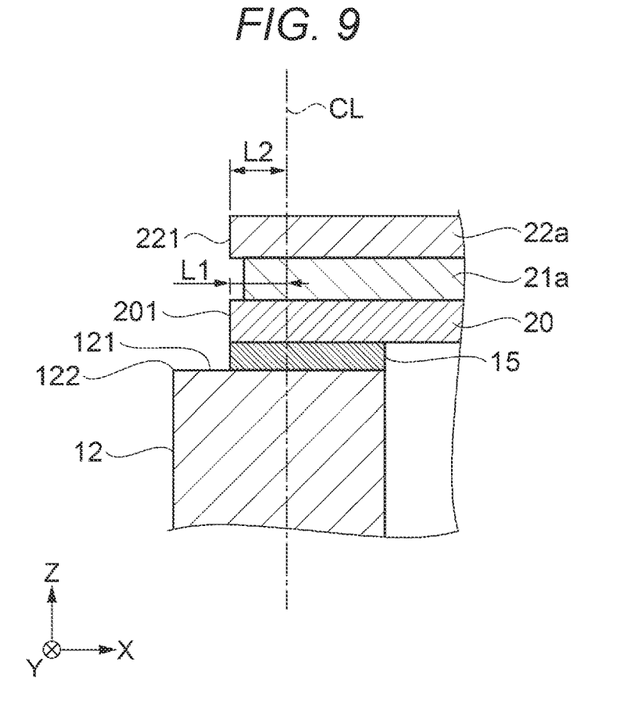
FIG. 9 is an enlarged view of a portion B in FIG. 8.

As shown in FIGS. 8 and 9, a second lid 22a of the electronic component 5a is disposed such that the outer edge 221 is flush with the outer edge 201 of the first lid 20. Specifically, a distance L2 between the outer edge 221 of the second lid 22a and the center line CL of the frame portion 12 of the base 10 in the X direction is equal to the distance L1 between the outer edge 201 of the first lid 20 and the center line CL of the frame portion 12 of the base 10 in the X direction.

The rigid member 21a is disposed between the first lid 20 and the second lid 22a, and does not protrude outward from the outer edge 201 of the first lid 20 and the outer edge 221 of the second lid 22a.

According to such a configuration, the outer edge 122 of the base 10 can be easily seen in the plan view from the Z direction, mounting on the printed substrate 2 can be performed with high positional accuracy, and the same effects as those of the electronic device 1 according to the first embodiment can be obtained.

3. Third Embodiment

Next, an electronic device 1b according to a third embodiment will be described with reference to FIG. 10.

The electronic device 1b according to the present embodiment is the same as the electronic device 1 according to the first embodiment except that a lid structure of an electronic component 5b is different from that of the electronic device 1 according to the first embodiment. Differences from the first embodiment described above will be mainly described, the same elements will be denoted by the same reference numerals, and description thereof will be omitted.

Figure 10:
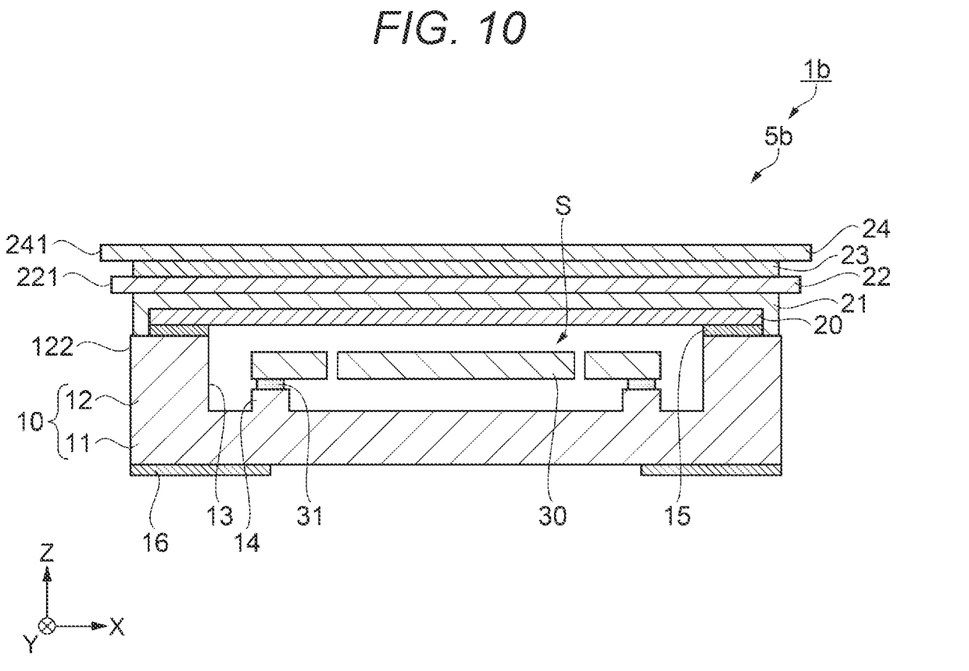
FIG. 10 is a cross-sectional view showing a schematic structure of an electronic component included in an electronic device according to a third embodiment.

As shown in FIG. 10, the lid structure of the electronic component 5b is a triple lid structure including the first lid 20, the second lid 22, and a third lid 24. That is, the third lid 24 is bonded onto the second lid 22 via a rigid member 23.

In addition, an area of an XY plane, which is a size of each lid, has a relationship of an area of the first lid 20≤an area of the second lid 22≤an area of the third lid 24. By increasing the areas of the lids from a lower lid to an upper lid, it is possible to make it more difficult for the first lid 20, which is the first lid, to be deformed and bend toward the inertial element 30 side. In addition, a thickness of each of the second and subsequent lids may be thicker or thinner than a thickness of the first lid 20 which is the first lid. When the thickness of each of the second and subsequent lids is thicker than the thickness of the first lid 20, strengths of the lids are increased and the lids are not easily deformed, and when the thickness of each of the second and subsequent lids is thinner than the thickness of the first lid 20, the strength of the lids is easily finely adjusted, and a size of the electronic device 1b can be reduced. It should be noted that overlapping displacement caused by the bonding of the second lid 22 and the third lid 24 is within an allowable range as long as a part of the outer edge 221 of the second lid 22 and a part of an outer edge 241 of the third lid 24 overlap the outer edge 122 of the base 10 in a plan view from the Z direction, so that the deformation of the first lid 20 can be sufficiently prevented.

According to such a configuration, the bending strength of the first lid 20 can be further increased, and the same effects as those of the electronic device 1 according to the first embodiment can be obtained.

4. Fourth Embodiment

Next, an electronic device 1c according to a fourth embodiment will be described with reference to FIG. 11.

The electronic device 1c according to the present embodiment is the same as the electronic device 1 according to the first embodiment except that a lid structure of an electronic component 5c is different from that of the electronic device 1 according to the first embodiment. Differences from the first embodiment described above will be mainly described, the same elements will be denoted by the same reference numerals, and description thereof will be omitted.

Figure 11:
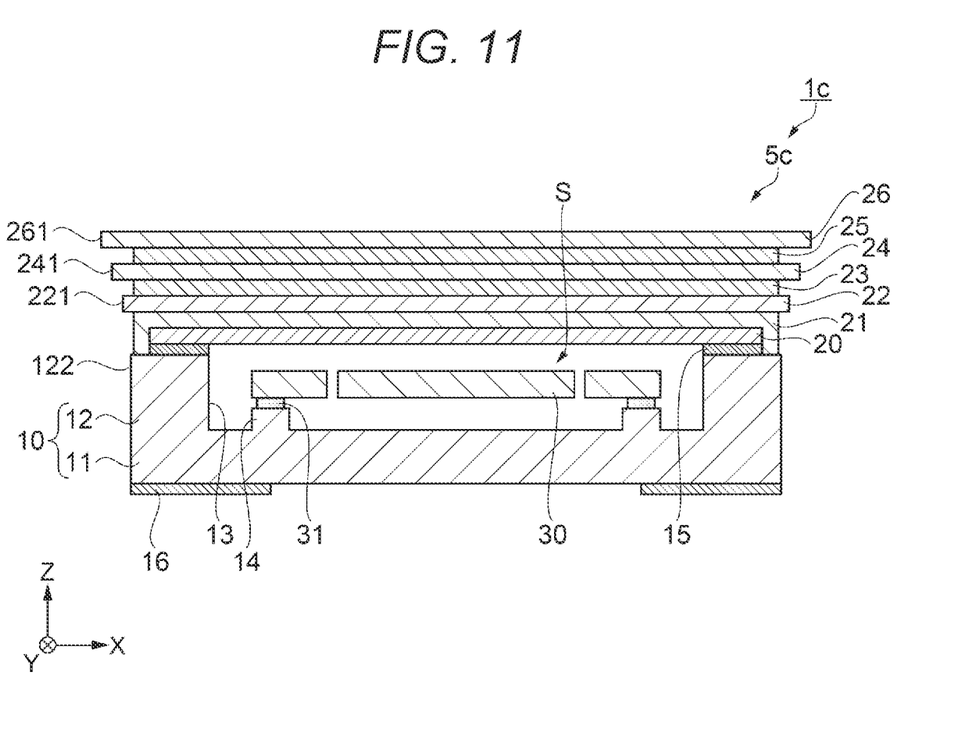
FIG. 11 is a cross-sectional view showing a schematic structure of an electronic component included in an electronic device according to a fourth embodiment.

As shown in FIG. 11, the lid structure of the electronic component 5c is a quadruple lid structure including the first lid 20, the second lid 22, a third lid 24, and a fourth lid 26. That is, the third lid 24 is bonded onto the second lid 22 via the rigid member 23, and the fourth lid 26 is bonded onto the third lid 24 via a rigid member 25.

In addition, the area of the XY plane, which is the size of each lid, has a relationship of an area of the first lid 20≤an area of the second lid 22≤an area of the third lid 24≤an area of the fourth lid 26. By increasing the areas of the lids from a lower lid to an upper lid, it is possible to make it more difficult for the first lid 20, which is the first lid, to be deformed and bend toward the inertial element 30 side. In addition, a thickness of each of the second and subsequent lids may be thicker or thinner than the thickness of the first lid 20 which is the first lid. When the thickness of each of the second and subsequent lids is thicker than the thickness of the first lid 20, strengths of the lids are increased and the lids are not easily deformed, and when the thickness of each of the second and subsequent lids is thinner than the thickness of the first lid 20, the strength of the lids is easily finely adjusted, and a size of the electronic device 1c can be reduced. It should be noted that overlapping displacement caused by the bonding of the second lid 22, the third lid 24 and the fourth lid 26 is within an allowable range as long as a part of the outer edge 221 of the second lid 22, a part of the outer edge 241 of the third lid 24, and a part of an outer edge 261 of the fourth lid 26 overlap the outer edge 122 of the base 10 in the plan view from the Z direction, so that the deformation of the first lid 20 can be sufficiently prevented.

According to such a configuration, the bending strength of the first lid 20 can be further increased, and the same effects as those of the electronic device 1 according to the first embodiment can be obtained.

5. Fifth Embodiment

Next, a method for manufacturing the electronic device 1 according to a fifth embodiment will be described with reference to FIG. 12.

The method for manufacturing the electronic device 1 according to the present embodiment is the same as the method for manufacturing the electronic device 1 according to the first embodiment except that an order of the second lid bonding step and the electronic component mounting step is different from that of the method for manufacturing the electronic device 1 according to the first embodiment. Differences from the first embodiment described above will be mainly described, the same elements will be denoted by the same reference numerals, and description thereof will be omitted.

Figure 12:
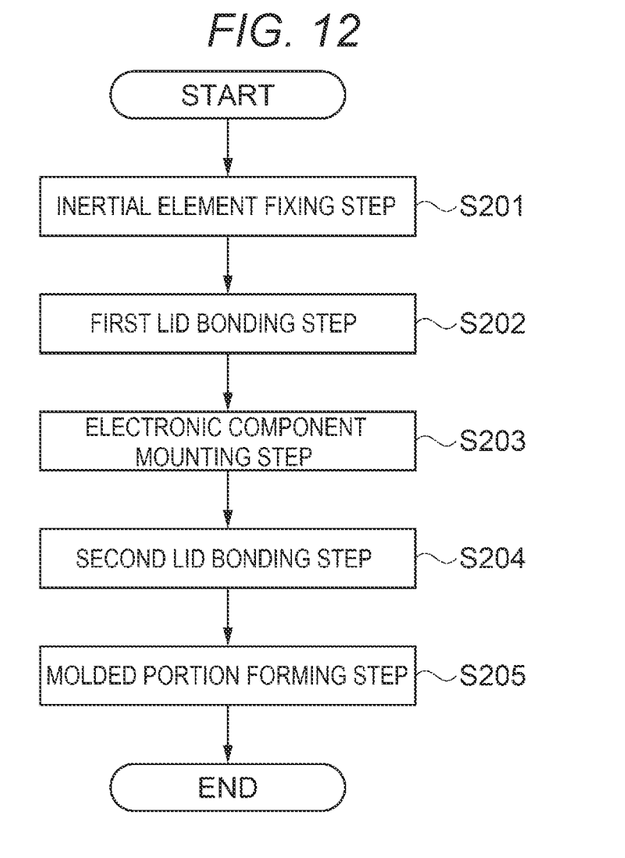
FIG. 12 is a flowchart showing a method for manufacturing an electronic device according to a fifth embodiment.

As shown in FIG. 12, the method for manufacturing the electronic device 1 according to the present embodiment is performed in the following order: the inertial element fixing step of step S201; the first lid bonding step of step S202; the electronic component mounting step of step S203; the second lid bonding step of step S204; and the molded portion forming step of step S205.

That is, after the electronic components 5, 6 manufactured in steps S201 and S202 and the IC chip 7 for driving the electronic components 5, 6 are mounted on the printed substrate 2, the second lid 22 is bonded onto the first lid 20 via the rigid member 21.

According to such a manufacturing method, the same effects as those of the method for manufacturing the electronic device 1 according to the first embodiment can be obtained.

What is claimed is:

1. An electronic device comprising:
an electronic component including
an inertial element,
a base including a substrate to which the inertial element is fixed and a frame portion provided to surround the inertial element in a plan view,
a first lid bonded to the frame portion so as to accommodate the inertial element between the first lid and the base,
a second lid provided to face the first lid and having an outer edge protruding outward from an outer edge of the first lid in a width direction of the electronic device orthogonal to a thickness direction of the electronic device in which the second lid faces the first lid, and
a rigid member disposed between the first lid and the second lid in the thickness direction; and
a molded portion covering the electronic component.

2. The electronic device according to claim 1, wherein the outer edge of the first lid is provided on a side closer to an outer edge of the frame portion with respect to a center of an upper surface of the frame portion of the base in the width direction.

3. The electronic device according to claim 1, wherein the rigid member protrudes outward from the outer edge of the first lid in the width direction.

4. The electronic device according to claim 2, wherein the outer edge of the first lid is disposed on an inner side with respect to an outer edge of the upper surface of the frame portion in the width direction, and
the rigid member is in contact with the upper surface of the frame portion of the base.

5. The electronic device according to claim 1, wherein a glass transition temperature of the rigid member is lower than a molding temperature of the molded portion by not more than 40° C.

6. A method for manufacturing an electronic device, comprising:
disposing an inertial element in a region surrounded by a frame portion of a base, and fixing the inertial element to a substrate of the base;
bonding a first lid to the frame portion of the base so as to accommodate the inertial element between the first lid and the base;
disposing a second lid such that the second lid faces the first lid via a rigid member and an outer edge of the second lid protrudes outward from an outer edge of the first lid in a width direction of the electronic device orthogonal to a thickness direction of the electronic device in which the second lid faces the first lid;
mounting an electronic component including the rigid member and the second lid on a printed substrate including a lead terminal; and
forming a molded portion covering the electronic component by a transfer molding method.

7. An electronic device comprising:
an electronic component including
an inertial element,
a base including a substrate to which the inertial element is fixed and a frame portion provided to surround the inertial element in a plan view,
a first lid bonded to the frame portion so as to accommodate the inertial element between the first lid and the base,
a second lid provided to face the first lid and having an outer edge flush with an outer edge of the first lid in a width direction of the electronic device orthogonal to a thickness direction of the electronic device in which the second lid faces the first lid, and
a rigid member disposed between the first lid and the second lid in the thickness direction, an outer edge of the rigid member being indented inwardly relative to the outer edge of the second lid and the outer edge of the first lid in the width direction; and
a molded portion covering the electronic component.

* * * * *